(12) United States Patent
Delshadpour et al.

(10) Patent No.: US 10,429,874 B1
(45) Date of Patent: Oct. 1, 2019

(54) REFERENCE VOLTAGE CIRCUIT WITH CURRENT BUFFER

(71) Applicant: NXP B.V., Eindhoven (NL)

(72) Inventors: Siamak Delshadpour, Phoenix, AZ (US); Xueyang Geng, San Jose, CA (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/228,420

(22) Filed: Dec. 20, 2018

(51) Int. Cl.
*G11C 5/14* (2006.01)
*G05F 3/24* (2006.01)
*H03F 3/45* (2006.01)
*H02M 3/07* (2006.01)

(52) U.S. Cl.
CPC ............. *G05F 3/24* (2013.01); *H02M 3/07* (2013.01); *H03F 3/45071* (2013.01); *H03F 2200/129* (2013.01); *H03F 2200/165* (2013.01); *H03F 2203/45116* (2013.01); *H03F 2203/45512* (2013.01)

(58) Field of Classification Search
CPC . G05F 3/262; G05F 3/265; G05F 3/30; G05F 3/205; G11C 5/147

USPC .......... 327/530, 538–543, 551–563
See application file for complete search history.

(56) References Cited

U.S. PATENT DOCUMENTS

| | | | |
|---|---|---|---|
| 4,502,020 A | 2/1985 | Nelson | |
| 4,525,327 A * | 6/1985 | Bardin | H01M 4/685 420/565 |
| 5,859,563 A * | 1/1999 | Yung | G05F 1/46 327/538 |
| 6,377,074 B1 * | 4/2002 | Kono | G05F 1/465 326/31 |
| 6,624,699 B2 * | 9/2003 | Yin | H03F 1/14 330/260 |
| 2002/0011826 A1 * | 1/2002 | Morishita | G05F 1/465 323/312 |
| 2010/0177232 A1 * | 7/2010 | Yu | H04N 5/3577 348/308 |

* cited by examiner

*Primary Examiner* — Anh Q Tra

(57) ABSTRACT

A reference voltage circuit with current buffer including a low voltage reference to output a low voltage, a first resistor-capacitor (RC) filter to filter the low voltage, a buffer circuit to output a current to be used by a load, a second RC filter associated with the load, and a capacitor in parallel with the buffer circuit configured to increase a rise time of the buffer.

14 Claims, 5 Drawing Sheets

REFERENCE VOLTAGE CIRCUIT WITH CURRENT BUFFER

TECHNICAL FIELD

Example embodiments disclosed herein relate generally to improving start-up time of a reference voltage while using a low current buffer from a bandgap voltage.

SUMMARY

A brief summary of various example embodiments is presented below. Some simplifications and omissions may be made in the following summary, which is intended to highlight and introduce some aspects of the various example embodiments, but not to limit the scope of the invention. Detailed descriptions of example embodiments adequate to allow those of ordinary skill in the art to make and use the inventive concepts will follow in later sections.

Example embodiments include a reference voltage circuit with current buffer, including a low voltage reference to output a low voltage, a first resistor-capacitor (RC) filter to filter the low voltage, a buffer circuit to output a current to be used by a load, a second RC filter associated with the load; and a capacitor in parallel with the buffer circuit configured to increase a current rise time of the buffer.

The low voltage reference may be a bandgap voltage reference.

The buffer may be an operational amplifier.

The circuit may include a series resistor in series with the output current of the buffer. A bypass circuit may be configured to bypass the series resistor when an output of the buffer is zero.

A bypass circuit may include a first transistor configured to allow the resistor to pass a series current when output of the buffer circuit exceeds a threshold voltage of the first transistor.

The first RC filter includes a first resistor and a first capacitor, and the second RC filter includes a second resistor and a second capacitor, such that a product of the first resistor and the first capacitor equals a product of the second resistor and the second capacitor.

An analog to digital converter may be coupled with the second RC filter.

The circuit may include a charge pump configured to receive the low voltage.

A resistor of the second RC filter may be in series with a current voltage bias generator.

The low voltage may feed into an inverted input of a comparator.

The low voltage may be configured to power a plurality of circuit loads. The circuit may include a charge pump in parallel with a current voltage bias generator. The circuit may include a comparator in parallel with an analog to digital converter.

BRIEF DESCRIPTION OF THE DRAWINGS

Additional objects and features of the invention will be more readily apparent from the following detailed description and appended claims when taken in conjunction with the drawings. Although several example embodiments are illustrated and described, like reference numerals identify like parts in each of the figures, in which:

FIG. 3 illustrates bias voltage VB settling time versus Io, buffer output current delivery in accordance with example embodiments described herein;

DETAILED DESCRIPTION

Figure 1:
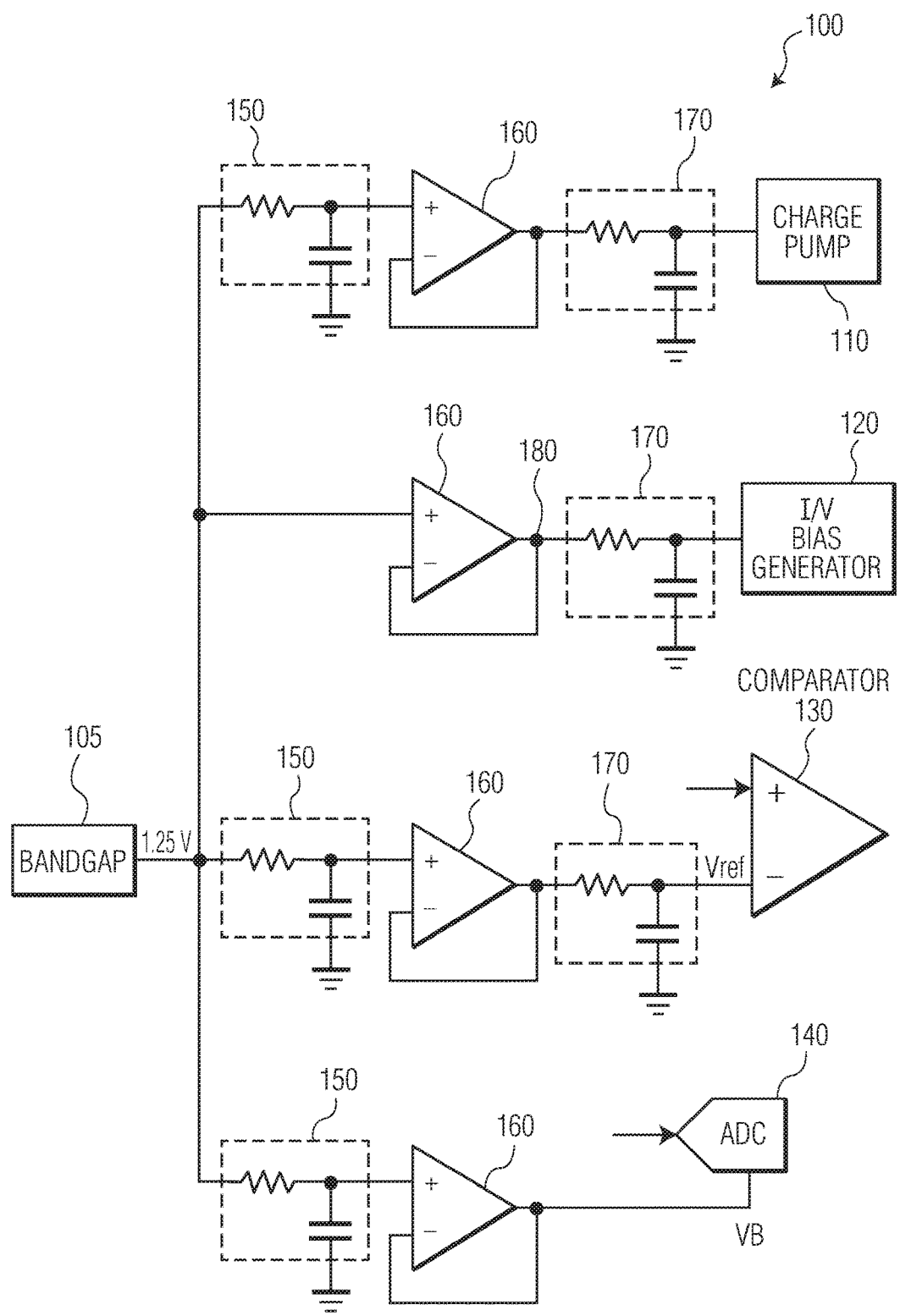
FIG. 1 illustrates an applied bandgap reference circuit using a bandgap reference voltage to provide reference voltages for different locations on a chip in accordance with example embodiments described herein.

The figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various example embodiments described herein are not necessarily mutually exclusive, as some example embodiments can be combined with one or more other example embodiments to form new example embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

Example embodiments describe a start-up time of a reference voltage, such as a start-up method that may be used for low current applications. The method may make use of a resistor-capacitor combination to improve a start-up time of a reference voltage or reference generator. According to example embodiments, low current buffer designs may be converted to high speed buffers.

Reference voltages and reference currents may be used in analog circuits and digital circuits. Generation of reference voltages and reference currents from a reliable source such as a bandgap voltage reference is known in the art. A bandgap voltage reference may be a low current block and consume a few micro amperes of current. The bandgap voltage reference may be isolated by different components before furnishing reference voltage to analog or digital circuits.

A load that is connected to a bandgap voltage reference may have a parasitic capacitor/resistor or an extra RC circuit that shapes a low pass filter that is being used before using the reference bandgap voltage. A high current buffer may provide faster charge for the capacitive load (which may be a parasitic capacitor or an added capacitor). In low current applications, a bandgap voltage buffer may not have a low current consumption. There may be a conflict between a circuit requirement that desires fast start-up and low current consumption. Resolution of this conflict is discussed herein.

A Universal Serial Bus (USB) type-C application is one area of technology that may use this application in which a voltage bus (VBUS) detection does need to be fast. A total budget of 100 uS may be available for analog and digital processing when a detection block is enabled.

Example embodiments may add a feed forward capacitor into a bandgap voltage reference path. The feed forward capacitor may have no impact during normal conditions and improve a power-up time when powering up a buffer. Example embodiments allow start-up time of a bandgap reference voltage that uses a low current slow buffer to be as fast as using a high current fast buffer. A low current slow buffer is a low bandwidth buffer with low current at its output branch. A high current fast buffer is a high bandwidth buffer with high current in its output branch. According to example embodiments, start-up time may be improved more than ten times compared to a buffer not using example embodiments, depending on the application and trade-offs.

In general, a bandgap reference voltage input may be being used in various places in a chip. A power system may use a dedicated bandgap voltage reference. Each circuit that uses the bandgap voltage reference may be isolated from the bandgap voltage reference using a buffer.

FIG. 1 illustrates an applied bandgap reference circuit 100 using a bandgap reference voltage 105 to provide reference voltages for different locations on a chip in accordance with example embodiments described herein. FIG. 1 illustrates an example of four circuits that may make use of the bandgap reference voltage 105. One circuit may be a charge pump 110. Another circuit may be a current/voltage bias generator 120. Another circuit may be a comparator 130, and a fourth circuit may be an analog-to-digital converter (ADC) 140. Circuits that use a bandgap reference voltage 105 are not limited to these examples. Any active or passive circuit may make use of the bandgap reference voltage 105 within a chip. Also, the bandgap reference voltage 105 may not be a bandgap circuit, but any type of low voltage reference source and thus example embodiments described herein may also be used with other low voltage reference sources. Unless otherwise stated, the use of the term bandgap reference voltage 105 is meant to represent a low voltage source in general.

Depending on a desired accuracy or application, circuits such as the charge pump 110, comparator 130, or ADC 140 may use a capacitor-resistor (RC) filter 150 after the bandgap reference voltage 105 to filter the output of the bandgap reference voltage 105. The RC filter 150 may have an effect of making an original start-up time slower.

In circuits that use a bandgap reference voltage 105, a buffer 160 may be used to deliver current to further circuits. A high bandwidth (BW) high current buffer may be desired than can deliver current quickly to further circuits, but a high current buffer consumes too much energy. Example embodiments use a low BW low current buffer in a configuration to act like a high current buffer, producing an efficient design. Without the buffer 160, the bandgap reference voltage 105 may consume a few uA of current and stay ON at all times (depending on whether a chip has a low power mode of chip) but a bandgap reference voltage 105 using a buffer 160 may be used only when needed. Thus the buffer 160 may be powered down when the bandgap reference voltage 105 is not needed.

In addition to the RC filter circuits 150, the further circuits 110-140 may have their own input resistance and input capacitance components 170 affiliated therewith. These resistance and capacitive components 170 may be part of an input circuit of the further circuits 110-140, may be associated with an input pin thereof, or may be parasitic in nature.

Figure 2:
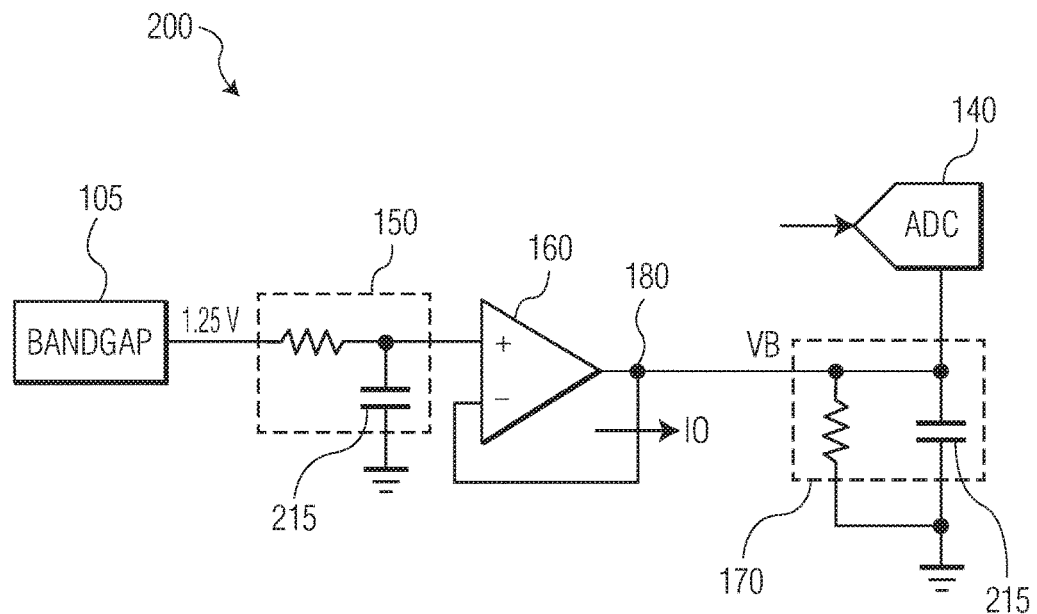
FIG. 2 illustrates a portion of the applied bandgap reference circuit in accordance with FIG. 1.

FIG. 2 illustrates a portion of the applied bandgap reference circuit 100 in accordance with FIG. 1. In FIG. 2, one buffered version of the bandgap reference voltage 105 is used. In this case, the buffered output voltage may be used for the ADC 140. When a voltage such as 1.25V from the bandgap reference voltage 105 is used, the capacitor 215 may fully charge to 1.25V. In a low current mode, the buffer 160 may be OFF, therefore an output VB of the buffer 160 may be 0. When the buffer 160 is turned on, a capacitor 225 may be charged from 0 V to 1.25V.

Based on voltage and current formula of a capacitor in which $i(t)=C\, dV(t)/dt$, which also can be achieved for an RC filter 150 case having an exponential behavior ($Vc(t)=Vbg(1-\exp(-t/RC))$), if the buffer 160 outputs a current Io, Vbg (from bandgap reference voltage 105)$=(Io/C)*t0$, and $t0=(Vbg*C/Io)$ which t0 represents a time that capacitor C may be charged to reach to Vbg value. This equation represents that a larger current Io will shorten t0, which may conflict with a low current design desired by example embodiments.

Because of a low bandgap reference voltage 105 on the order of 1.25 volts, the buffer 160 may use very low current. However, to power a node 180, a high current buffer may be desired.

Figure 3:
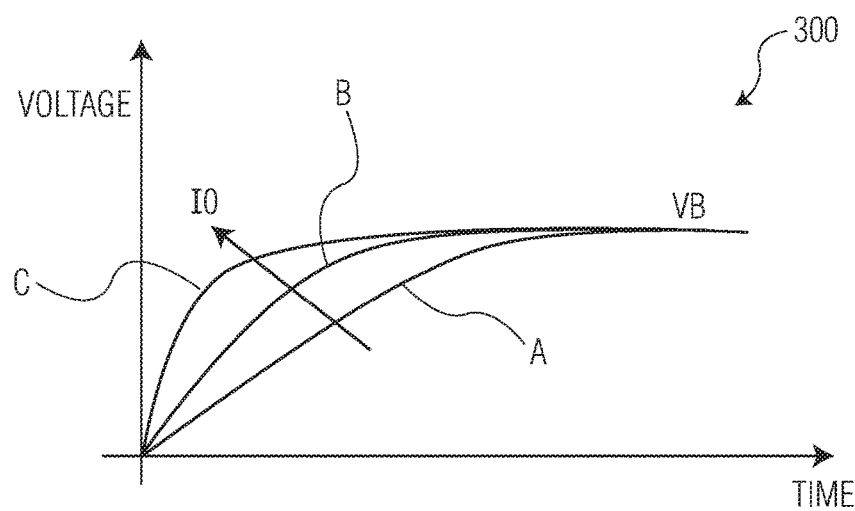
FIG. 3 illustrates bias voltage VB settling time in relation to the buffer output current Io and the buffer current delivery in accordance with example embodiments described herein.

FIG. 3 illustrates bias voltage VB settling time versus I0, buffer output current delivery in accordance with example embodiments described herein. The abscissa may represent a time, or settling time, of the voltage VB output from the buffer 160 to a capacitor 225 (illustrated in FIG. 2). The settling time may be representative of the time taken for the capacitor 225 to settle in to a fully charged state. The ordinate may represent a voltage of the capacitor 225 at a given time. The curved lines A, B, and C, represent an amount of current, IO, used to charge the capacitor 225. Curve A represents that having a small rise in current through the buffer 160 will yield a longer settling time of the voltage VB at the buffer 160. At curve B, with a higher current rise, the settling time will be shorter. Curve C represents an even faster current rise, and shorter settling time of the buffer output VB. The graph 300 reveals that a lower applied current Io corresponds to a slow settling time (curve A) of the voltage VB. Fast rise time may be associated with a higher current.

Figure 4A:
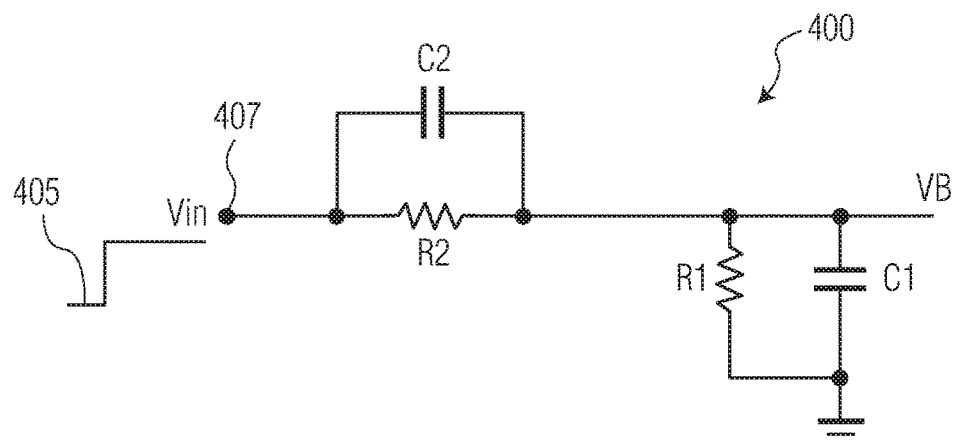
FIG. 4A illustrates a circuit in accordance with example embodiments described herein.

FIG. 4A illustrates a circuit 400 in accordance with example embodiments. FIG. 4A illustrates an RC network in which Vin is applied to the buffer 160 in form of a step 405 to an input 407. A resistance of the buffer 160 may be designated by R2. An output settling time of VB from the buffer 160 may depend on three conditions. An input resistance of a circuit element such as the ADC 140 (illustrated in FIG. 2) may be designated R1. An input or parasitic capacitance of the ADC 140 may be designated C1. Example embodiments use a small capacitor in parallel with the buffer 160 (resistor R2) to increase a current rise time. The current rise time is increased because the small capacitor may be charged to reach to a certain voltage through the buffer 160. An increase rise time may deliver faster bias voltages to circuits.

Figure 4B:
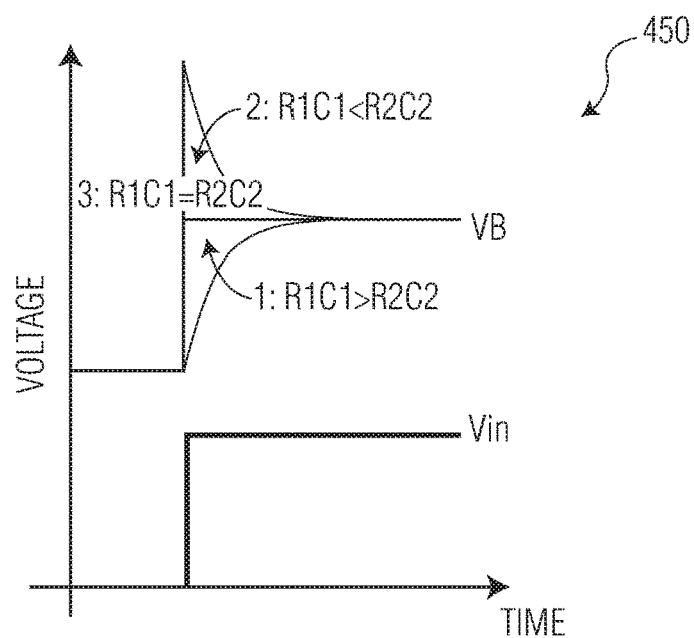
FIG. 4B illustrates voltage jump and settling time relationships in accordance with FIG. 4A.

FIG. 4B illustrates voltage jump and settling time relationships 450 in accordance with FIG. 4A. If a product of R1 and C1 is greater than R2*C2, then an output voltage VB will deviate from Vin, have a curved and short settling time from low to high. If R1*C1<R2*C2, the output voltage VB will deviate from Vin, have an inverse uneven and short settling time. Ideally, R1*C1=R2*C2, and the output VB will follow the input Vin, such that the settling time of VB will be longer and steady.

Figure 4C:
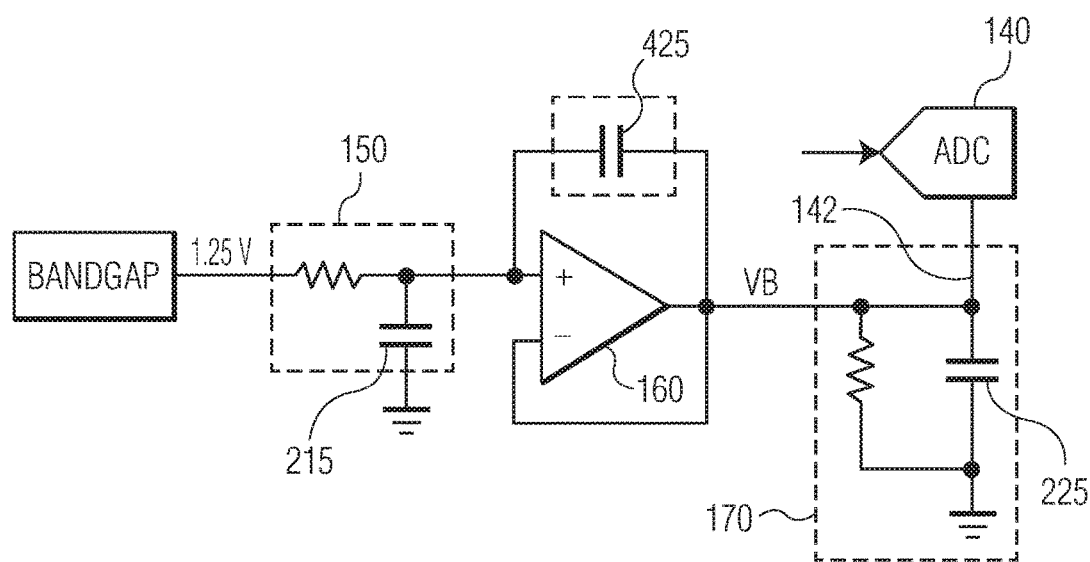
FIG. 4C illustrates a circuit in accordance with example embodiments described herein.

FIG. 4C illustrates a circuit in accordance with example embodiments described herein. A capacitor 425 is inserted in parallel with the buffer 160. Inserting the capacitor 425 may provide flexibility of improving a settling time of the buffer. The buffer 160 can be considered as a resistor because of the resistive effect of the buffer 160. The resistive effect of the buffer 160 may be represented by the resistor R2 of FIG. 4A, the resistor R2 being of a large size such as in the tens to hundreds of Mega-ohms. Using a large resistor R2 allows the capacitor 425 to have a small value.

Adding the capacitor 425 of a small value on the order of 380 fF may improve the start-up time of the buffer 160 output voltage VB from a duration of 500 µs without the capacitor 425, to a shorter duration of 50 µS or less with the capacitor 425. With the addition of the capacitor 425, a low current buffer 160 will perform as a high current buffer.

Adding the capacitor 425 may provide a path from the bandgap reference voltage 105 or capacitor 215 to capacitor 225 to provide charges to capacitor 225 from the bandgap reference voltage 105 and/or capacitor 215. This may improve charging time of capacitor 225 which may be equal to or faster than a settling time for a desired reference voltage.

A shorter settling time may benefit a circuit such as the ADC 140. An ADC 140 reference voltage may be input at node 142 that uses the reference voltage VB. A maximum needed time for the ADC 140 startup may be on the order of 150 µS. Not using example embodiments described herein, an original start-up time of the ADC 140 would be on the order of 500 uS. Adding the capacitor 425 lowers the start-up time of the ADC 140 to 50 µS which may comply with a total time of less than 150 µS of a VBUS monitoring system using the ADC 140.

Figure 5:
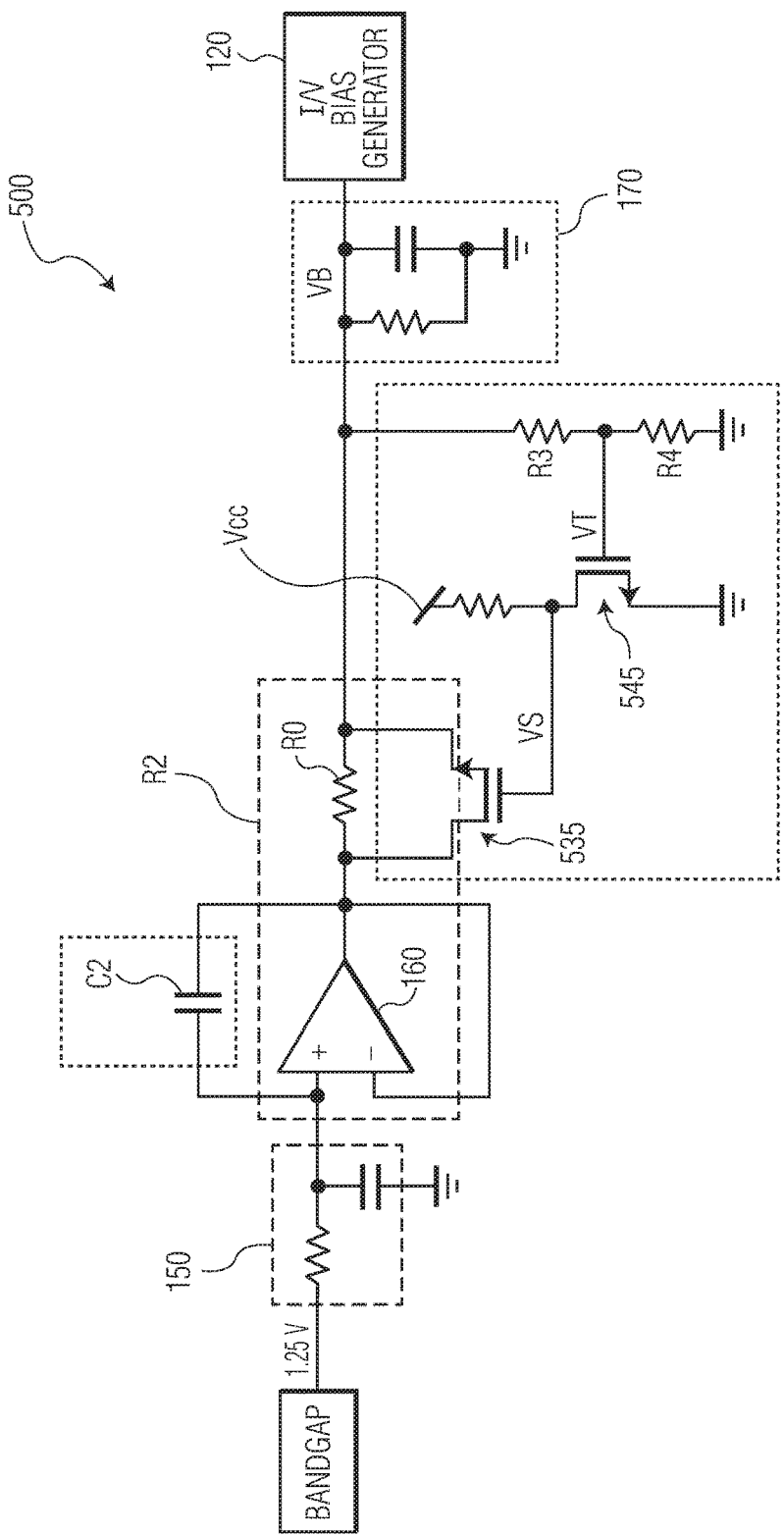
FIG. 5 illustrates another circuit in accordance with example embodiments described herein.

FIG. 5 illustrates another circuit 500 in accordance with example embodiments described herein. In some cases, increased RC filtering may be desired and a resistor R0 may be used at a buffer 160 output. During startup, and when VB is yields less than a threshold voltage of a transistor 545, the resistor R0 may by bypassed. When a voltage rises at VB to be greater than a threshold condition a transistor 545 and resistor R0 may be used. The buffer 160 and resistor R0 may combine to represent the resistor R2 illustrated in FIG. 4.

A voltage divider for transistor 545 may have the ratio R3/R4~0.5625. When VB=0, the voltage through the voltage divider R3/R4 will be zero. The NMOS transistor 545 will be OFF. A voltage Vs at the source will be Vcc, a high to turn on the transistor 535. With transistor 535 ON, and the resistor R0 will be bypassed.

When VB reaches a final value (~1.25V), a voltage at VT will exceed a threshold voltage of the transistor 545, and the transistor 545 will be ON. The voltage Vs at the source will be pulled down to ground. The substantially zero voltage at Vs will turn the transistor 535 off, bringing resistor R0 into play, and VB may be used after the low pass filter buffer 160. C2 plays a role like it did in FIG. 4C. R3 and R4 are selected in a way that VT~0.8 V (slightly higher than the threshold voltage of NMOS transistor 545 when VB~1.25V, such that R4/(R4+R3)~0.8/1.25 or equally, R3.

Example embodiments may be used for any kind of bias or reference voltage which may be a buffered version of another reference voltage like a Bandgap. Techniques described herein implement and use a low current small buffer to perform as a high current fast buffer during start-up.

Although the various example embodiments have been described in detail with particular reference to certain exemplary aspects thereof, it should be understood that the invention is capable of other example embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

The invention claimed is:

1. A reference voltage circuit with current buffer, comprising:
   a low voltage reference to output a low voltage;
   a first resistor-capacitor (RC) filter to filter the low voltage;
   a buffer circuit to output a current to be used by a load;
   a second RC filter associated with the load; and
   a capacitor in parallel with the buffer circuit configured to increase a rise time of the buffer.

2. The circuit of claim 1, wherein the low voltage reference is bandgap voltage reference.

3. The circuit of claim 1, wherein the buffer is an operational amplifier.

4. The circuit of claim 1, comprising a series resistor in series with the output current of the buffer.

5. The circuit of claim 4, comprising a bypass circuit configured to bypass the series resistor when an output of the buffer is zero.

6. The circuit of claim 4, comprising a bypass circuit including a first transistor configured to allow the resistor to pass a series current when output of the buffer circuit exceeds a threshold voltage of the first transistor.

7. The circuit of claim 1, wherein the first RC filter includes a first resistor and a first capacitor, and the second RC filter includes a second resistor and a second capacitor, such that a product of the first resistor and the first capacitor equals a product of the second resistor and the second capacitor.

8. The circuit of claim 1, wherein an analog to digital converter is coupled with the second RC filter.

9. The circuit of claim 1, comprising a charge pump configured to receive the low voltage.

10. The circuit of claim 1, wherein a resistor of the second RC filter is in series with a current voltage bias generator.

11. The circuit of claim 1, wherein the low voltage feeds into an inverted input of a comparator.

12. The circuit of claim 1, wherein the low voltage is configured to power a plurality of circuit loads.

13. The circuit of claim 12, comprising a charge pump in parallel with a current voltage bias generator.

14. The circuit of claim 12, comprising a comparator in parallel with an analog to digital converter.

* * * * *